United States Patent [19]

Matsumoto et al.

[11] Patent Number: 5,492,734
[45] Date of Patent: Feb. 20, 1996

[54] METHOD OF FORMING DEPOSITION FILM

[75] Inventors: Shigeyuki Matsumoto, Atsugi; Osamu Ikeda, Tokyo, both of Japan

[73] Assignee: Canon Kabushiki Kaisha, Tokyo, Japan

[21] Appl. No.: 261,883

[22] Filed: Jun. 17, 1994

Related U.S. Application Data

[63] Continuation of Ser. No. 829,289, Feb. 3, 1992, abandoned.

[30] Foreign Application Priority Data

Feb. 4, 1991 [JP] Japan ................................ 3-013395
Feb. 4, 1991 [JP] Japan ................................ 3-013398

[51] Int. Cl.$^6$ .......................... B05D 3/06; B05D 3/00; C23C 16/00
[52] U.S. Cl. .................. 427/535; 427/576; 427/578; 427/252; 427/255; 427/255.1; 427/255.2; 204/298.25
[58] Field of Search .......................... 427/535, 576, 427/578, 252, 255.1, 255.2; 204/298.25

[56] References Cited

U.S. PATENT DOCUMENTS

| | | | |
|---|---|---|---|
| 4,861,623 | 8/1989 | Veki et al. | 427/253 |
| 5,091,210 | 2/1992 | Mikoshiba et al. | 427/569 |
| 5,151,305 | 9/1992 | Matsumoto et al. | 427/250 |
| 5,154,949 | 10/1992 | Shindo et al. | 427/253 |
| 5,208,187 | 5/1993 | Tsubouchi et al. | 437/245 |
| 5,330,633 | 7/1994 | Matsumoto et al. | 204/298.25 |
| 5,364,664 | 11/1994 | Tsubouchi et al. | 427/535 |

FOREIGN PATENT DOCUMENTS

| | | |
|---|---|---|
| 0255454 | 2/1988 | European Pat. Off. . |
| 0417997 | 3/1991 | European Pat. Off. . |
| 0420595 | 4/1991 | European Pat. Off. . |
| 0425084 | 5/1991 | European Pat. Off. . |
| 283374 | 11/1989 | Japan ................ 427/253 |
| 882214 | 11/1961 | United Kingdom ........ 427/252 |
| 2041983 | 9/1980 | United Kingdom . |
| WOA8606756 | 11/1986 | WIPO . |

OTHER PUBLICATIONS

IBM Technical Disclosure Bulletin. vol. 28, No. 8, Jan. 1986, pp. 3530–3531, "Selective Deposition of Studs to Interconnect Metalization layers Separted by an Insulator."

K. Tsubouchi et al., "Selective And Nonselective Deposition of Aluminum By LPCVD Using DMAH and Microregion Observation of Single Crystal Aluminum With Scanning μ–Rheed Microscope," *1990 Symposium on VLSI Technology*, Jun. 4–7, 1990, pp. 5–6.

K. Tsubouchi et al., "Complete planarization of via holes with aluminum by selective and nonselective chemical vapor deposition," *Applied Physics Letters*, vol. 57, No. 12, Sep. 17, 1990, pp. 1221–1223.

S. D. Hossain et al., "Removal of Surface Organic Contaminants during Thermal Oxidation of Silicon," *Journal of the Electrochemical Society*, vol. 137, No. 10, Oct. 1990, pp. 3287–3291.

Patent Abstracts of Japan, vol. 13, No. 42 (C–564), Jan. 30, 1989 & JP–A–63–239195 (Japan Synthetic Rubber Co., Ltd.) Oct. 5, 1988.

G. S. Higashi et al., "Ideal hydrogen termination of the Si(111) surface," *Applied Physics Letters*, vol. 56, No. 7, Feb. 12, 1990, pp. 656–658.

J. A. Thornton, "Plasma–Assisted Deposition Processes: Theory, Mechanisms And Appllictions", *Thin Solid Films*, vol. 107, No. 1, Sep. 1983, pp. 3–19.

Primary Examiner—Anthony McFarlane
Attorney, Agent, or Firm—Fitzpatrick, Cella, Harper & Scinto

[57] ABSTRACT

This invention provides a method of forming a deposition film serving as a high-quality wiring layer having good stress migration durability against any material such as a non-monocrystalline material. A substrate is located in a deposition film formation space, a gas of an alkylaluminum halide is supplied to the deposition film formation space, and an aluminum film is selectively formed on an electron donor surface at a partial pressure of the alkylaluminum halide of $7 \times 10^{-3}$ Torr to $9 \times 10^{-2}$ Torr in the range of a decomposition temperature or more of the alkylaluminum halide and 450° C. or less. When deposition is to be performed on the non-monocrystalline material, a chemical treatment for terminating with hydrogen atoms a non-electron donor surface of a substrate having the electron donor surface and the non-electron donor surface is performed, and the deposition film is deposited by a non-selective deposition method.

4 Claims, 5 Drawing Sheets

FIG. 1(a)
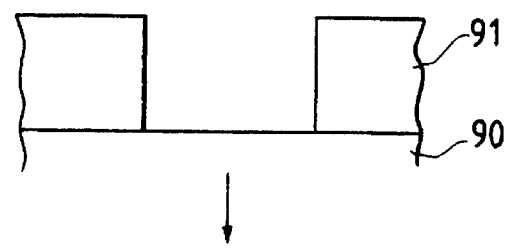
FIG. 1(b)
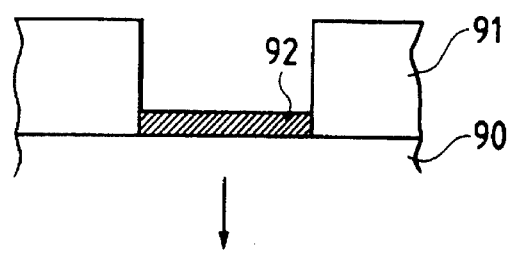
FIG. 1(c)
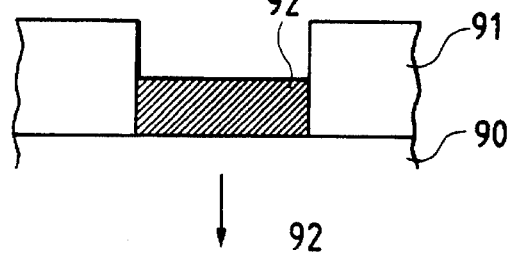
FIG. 1(d)
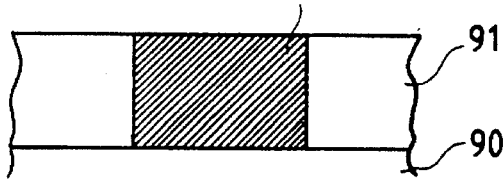
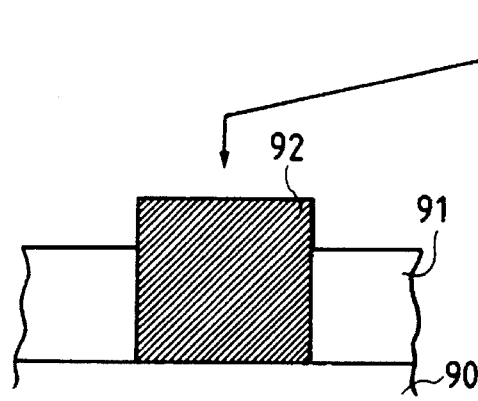
FIG. 1(e)
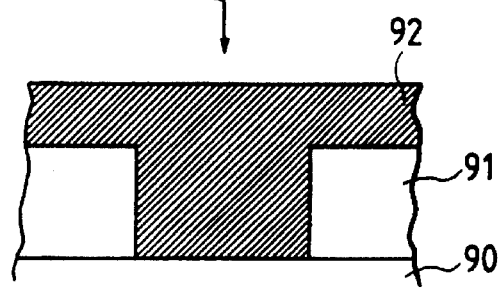
FIG. 1(f)

::page-number-omitted::

METHOD OF FORMING DEPOSITION FILM

This application is a continuation of application Ser. No. 07/829,289, filed Feb. 3, 1992, now abandoned.

BACKGROUND OF THE INVENTION

1. Field of the Invention

The present invention relates to a method of forming a metal film and, more particularly, to a method of forming an Al deposition film preferably applied to a wiring layer in a semiconductor integrated circuit device or the like.

2. Related Background Art

Aluminum (Al), Al—Si, and the like have been mainly used as materials for electrodes and wiring layers in conventional electronic devices and integrated circuits using semiconductors. Since Al is inexpensive, has a high electrical conductivity, and can form a dense oxide film on a surface, an internal structure can be chemically protected and stabilized by an Al deposition layer. In addition, Al has a high adhesion strength with Si, thus providing various advantages.

In recent years, since the packing density of integrated circuits such as LSIs has been increased and micropatterning of wiring layers and formation of multi-layered wiring films have been required, more strict conditions are imposed on conventional Al wiring layers. Along with an increase in density of micropatterning as a result of an increase of the packing density, surfaces of LSIs and the like have been roughened due to oxidation, diffusion, thin-film deposition, etching, and the like. For example, an electrode and a wiring metal must have excellent step coverage without any disconnection when they are deposited on stepped surfaces. At the same time, the electrode and the wiring metal must be deposited in small, deep via holes. In a 4- or 16-Mbit DRAM (dynamic RAM), an aspect ratio (i.e., (length of via hole)÷(diameter of via hole)) of a via hole in which a metal such as Al must be deposited is 1.0 or more. The diameter of the via hole itself becomes 1 µm or less. Therefore, a technique for depositing Al in a via hole having a high aspect ratio is required.

Al or the like must be deposited not only in the via hole but also on an insulating film. In addition, this deposition film must be excellent in quality.

The present inventors have recently proposed a CVD method using a dimethylaluminum hydride as a technique for forming an Al film.

This method is effective as a future micropatterning technique in semiconductor fabrication techniques. However, there is much left to be solved to increase a production yield of semiconductor devices, decrease the cost, and achieve an industrial success in the following respects.

There is a method of forming a flat multi-layered wiring pattern, including the step of forming an insulating film having a square contact hole having a side of 0.8 µm in a monocrystalline silicon substrate and selectively depositing monocrystalline aluminum in this contact hole by a CVD method using DMAH and hydrogen, the step of forming an electrode extraction layer consisting of a conductive material (e.g., W or titanium nitride) on the aluminum and the insulating layer, and the step of depositing aluminum on the entire surface. When this method is used, aluminum can be selectively deposited in the contact hole with good reproducibility. However, aluminum on titanium nitride is not deposited with good reproducibility as in aluminum deposited in the contact hole.

When a barrier metal such as titanium nitride is formed in a contact hole and aluminum is to be selectively deposited thereon, reproducibility is often degraded as compared with aluminum directly deposited on monocrystalline silicon.

When annealing is repeatedly performed in the semiconductor fabrication process, disconnections and short circuits may be formed in wiring layers. This typically occurs in a wiring film having three or more layers.

The present inventors have made various experiments and extensive studies to find a reason for reduction of a product yield because the following causes interaction with each other.

The first cause is formation of defects during initial aluminum deposition. The second cause is a problem of an interface between aluminum and an underlying material when aluminum is deposited in a contact hole defined by the underlying material. The third cause is a migration problem. Another cause is a difference in yield between aluminum deposited in the contact hole and aluminum formed on the underlying layer, i.e., the insulating film during formation and a difference in film quality therebetween.

SUMMARY OF THE INVENTION

It is an object of the present invention, in consideration of the conventional technical problems described above, to provide a method of forming a metal film, which is free from generation of Al spikes, and provides excellent step coverage and a flat multi-layered wiring film.

It is another object of the present invention to provide a method of forming a metal film excellent in stress migration and durability.

It is still another object of the present invention to provide a method of forming a deposition film, comprising the steps of: performing a chemical surface-treatment for causing an electron donor surface to terminate with hydrogen atoms in a substrate having the electron donor surface consisting of a non-monocrystalline material and a non-electron donor surface, and locating the substrate in a deposition film formation space; supplying a gas of an alkylaluminum hydride to the deposition film formation space; and selectively forming a metal film containing aluminum as a major constituent on the electron donor surface while the substrate is kept at a predetermined temperature which is not less than a decomposition temperature of the alkylaluminum hydride.

It is still another object of the present invention to provide a method of forming a deposition film, comprising the steps of:

locating a substrate in a deposition film formation space of a CVD apparatus capable of generating a plasma, the substrate having an electron donor surface consisting of a non-monocrystalline material and a non-electron donor surface;

supplying a gas of an alkylaluminum hydride to the deposition film formation space;

selectively forming a metal film containing aluminum as a major constituent on the electron donor surface while the electron donor surface is kept at a predetermined temperature which is not less than a decomposition temperature of the alkylaluminum hydride; and generating the plasma in the CVD apparatus while the gas of the alkylaluminum hydride is supplied, and forming the metal film containing aluminum as the major constituent and a metal film containing aluminum as a major constituent on the non-electron donor surface, wherein the plasma having a plasma area where an electron density of the plasma falls within a range of $1\times10^8$ to $8\times10^{10}$ cm$^{-3}$ near a surface of the substrate is generated to form the metal films.

It is still another object of the present invention to provide a method of forming a metal film, comprising the steps of:

performing a chemical surface-treatment for causing an electron donor surface to terminate with hydrogen atoms in a substrate having the electron donor surface consisting of a non-monocrystalline material and a non-electron donor surface, and locating the substrate in a deposition film formation space;

supplying a gas mixture containing a gas of an alkylaluminum hydride to the deposition film formation space so that a partial pressure of the gas of the alkylaluminum halide falls within a range of $7\times10^{-3}$ to $9\times10^{-2}$ Torr; and selectively forming a metal film containing aluminum as a major constituent on the electron donor surface while the substrate is kept at a predetermined temperature which is not less than a decomposition temperature of the alkylaluminum hydride.

It is still another object of the present invention to provide a method of forming a deposition film including the steps of: performing a chemical surface-treatment for causing an electron donor surface to terminate with hydrogen atoms in a substrate having the electron donor surface consisting of a non-monocrystalline material and a non-electron donor surface, and locating the substrate in a deposition film formation space; supplying a gas of an alkylaluminum hydride and hydrogen gas to the deposition film formation space so that a partial pressure of the gas of the alkylaluminum hydride falls within a range of $7\times10^{-3}$ to $9\times10^{-2}$ Torr; and selectively forming a metal film containing aluminum as a major constituent on the electron donor surface while the substrate is kept at a predetermined temperature which is not less than a decomposition temperature of the alkylaluminum hydride and not more than 450° C.

It is still another object of the present invention to provide a method of forming a deposition film, comprising the steps of: locating a substrate in a deposition film formation space of a CVD apparatus capable of generating a plasma, the substrate having an electron donor surface consisting of a non-monocrystalline material and a non-electron donor surface; supplying a gas of an alkylaluminum hydride to the deposition film formation space so that a partial pressure of the gas of alkylaluminum hydride falls within a range of $7\times10^{-3}$ to $9\times10^{-2}$ Torr; selectively forming a metal film containing aluminum as a major constituent on the electron donor surface while the electron donor surface is kept at a predetermined temperature which is not less than a decomposition temperature of the alkylaluminum hydride; and generating the plasma in the CVD apparatus while the gas of the alkylaluminum hydride is supplied, and forming the metal film and a metal film containing aluminum as a major constituent on the non-electron donor surface, wherein the plasma having a plasma area where an electron density of the plasma falls within a range of $1\times10^8$ to $8\times10^{10}$ cm$^{-3}$ near a surface of the substrate is generated to form the metal films.

BRIEF DESCRIPTION OF THE DRAWINGS

FIGS. 1(a) to 1(f) are views for explaining the steps in forming a metal film according to an embodiment of the present invention;

DETAILED DESCRIPTION OF THE PREFERRED EMBODIMENTS

Figure 2A:
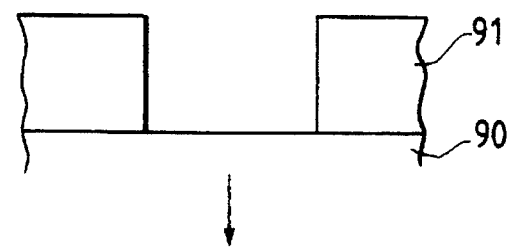
FIGS. 2(a) to 2(f) are views for explaining the steps in forming a metal film according to another embodiment of the present invention.

A method of forming a deposition film using an organic metal is summarized as follows.

An organic metal deposition reaction and hence a thin-film deposition reaction greatly vary depending on conditions such as types of metal atoms, types of alkyl groups bonded to the metal atoms, a means for causing the decomposition reaction, and a gas atmosphere.

For example, even in a decomposition reaction of Al or Ga with an organic metal consisting of a $CH_3$, $C_2H_5$, or $iC_4H_9$ group as the simplest alkyl group, a reaction form varies depending on the types of alkyl groups, types of metal atoms, and an excitation decomposition means. In order to deposit metal atoms decomposed from an organic metal on a desired substrate, the decomposition reaction must be strictly controlled. For example, in order to deposit Al from triisobutylaluminum, i.e., in the following reaction,

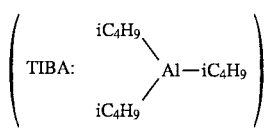

in a conventional low-pressure CVD using a thermal reaction, projections on the order of microns are formed on the surface, and a surface morphology is degraded. Hillocks are formed by annealing, and Si surface roughening occurs at an interface between Al and Si due to Si diffusion. In addition, migration durability is also degraded. It is therefore difficult to use this reaction in an industrial VLSI process.

As described above in detail, deposition film formation conditions in the CVD method using an organic metal are complicated due to a general nature wherein chemical properties of the organic metal are greatly changed in accordance with types and combinations of organic substituent groups bonded to metal atoms.

When the above reaction is applied to a very large integrated circuit such as a DRAM having a 4-Mbit capacity or more, impractical deposition films (wiring layers) are formed even if film formation conditions are slightly changed.

A method of forming a deposition film must be a method of forming a high-quality film which can be applied in a relatively general range except for a limited application in which an apparatus is complicated due to the limited film formation conditions.

The present inventors have prepared a large number of organic metals to find a condition which satisfies a standard applied to a large integrated circuit and made various experiments and extensive studies on different gas reaction states of reaction gases, different carrier gases, and different substrate temperatures.

The present inventors have found that an alkylaluminum hydride is used as a source gas to satisfy a parameter for providing highly general film formation conditions. As a result of further extensive studies, the present inventors have found that film formation conditions preferably applied to large integrated circuits are given as follows.

An alkylaluminum hydride gas is used as a source gas, $H_2$ gas is used as a reaction gas, a substrate has an electron donor surface (A) and a non-electron donor surface (B). The temperature of the electron donor surface is the decomposition temperature or more of the alkylaluminum hydride and is 450° C. or less. By using these film formation materials, Al can be deposited in a via hole with excellent surface flatness and excellent denseness.

Dimethylalkylaluminum hydride (DMAH) as an alkylaluminum hydride according to the present invention is a known material as an alkyl metal. A relationship between reaction forms and Al thin films to be deposited cannot be expected unless deposition films are formed under all possible conditions. For example, when Al is deposited using DMAH by a photo-CVD method, a surface morphology is degraded, and a resistivity falls within the range of several $\mu\Omega$.cm to 10 $\mu\Omega$.cm, whose smallest value is larger than a bulk value (2.7 $\mu\Omega$.cm). In addition, film quality is poor.

To the contrary, according to the present invention, a CVD method is used to selectively deposit a high-quality Al or Al—Si film as a conductive deposition film on a substrate.

Dimethylaluminum hydride (DMAH) represented by the following formula:

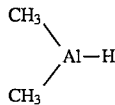

or monomethylalkylaluminum hydride (MMAH$_2$) represented by the following formula:

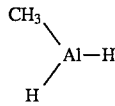

is used as a source gas having at least one atom constituting one of the components of a deposition film, and $H_2$ is used as a reaction gas. These gases are mixed to epitaxially grow an Al film on a substrate. Alternatively, a gas containing dimethylaluminum hydride (DMAH) or monomethylaluminum hydride (MMAH$_2$), and Si as a source gas is used, and $H_2$ is used as a reaction gas. A mixture of these gases is used to epitaxially grow an Al—Si film on a substrate.

According to an embodiment of the present invention, the partial pressure of alkylaluminum hydride as the source gas particularly falls within the range of $7 \times 10^{-3}$ to $9 \times 10^{-2}$ Torr. When Al is deposited under this pressure condition, an Al film excellent in stress migration durability can be obtained.

A substrate applied to the present invention has a first substrate surface material for forming a surface on which Al is to be deposed and a second substrate surface material for forming a surface on which Al is not deposited. An electron donor material is used as the first substrate surface material.

The electron donor will be described in detail below.

The electron donor material is a material in which free electrons are present in a substrate or free electrons are intentionally produced. For example, the electron donor material is defined as a material having a surface on which a chemical reaction is accelerated by electron exchange with source gas molecules attached to the substrate surface. In addition, a material having a thin oxide film on its surface is also defined as the electron donor material because a chemical reaction occurs due to electron exchange between the substrate and the material molecules attached to the substrate surface.

More specifically, the electron donor materials are p- and n-type semiconductors (e.g., monocrystalline silicon, polysilicon, and amorphous silicon), a two-, three-, or four-component Group III-V compound semiconductor as a combination of Ga, In, or Al as a Group III element and P, As, or N as a Group V element, and a metal, an alloy, and a silicide, which latter three are exemplified by tungsten, molybdenum, tantalum, tungsten silicide, titanium silicide, aluminum, aluminum/silicon, titanium/aluminum, titanium nitride, copper, aluminum/silicon/copper, aluminum/palladium, titanium, molybdenum silicide, and tantalum silicide.

To the contrary, a material for forming a surface on which Al or Al—Si is not selectively deposited, i.e., a non-electron donor material, is exemplified by silicon oxide formed by thermal oxidation, CVD, sputtering, or the like, glass (e.g., BSG, PSG, or BPSG), an oxide film, a thermal nitride film, and a silicon nitride film formed by plasma CVD, low-pressure CVD, ECR-CVD, or the like.

Al is deposited on such a substrate by a simple thermal reaction in a reaction system between a source gas and $H_2$. A thermal reaction in a reaction system between, e.g., DMAH and $H_2$ is performed at a substrate temperature of 160° C. to 450° C. as follows:

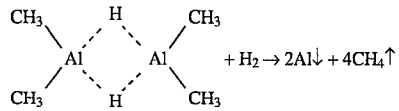

When a gas containing Al or Si is added by the above reaction, Al—Si can be deposited on only a surface having an electron donor material.

DMAH and $H_2$ are used to deposit pure Al. DMAH, $Si_2H_6$, and $H_2$ are used to deposit Al—Si.

FIGS. 1(a) to 1(e) are views showing the steps in selective growth using a combination of DMAH and $H_2$ or a combination of DMAH, $Si_2H_6$, and $H_2$.

FIG. 1(a) is a view illustrating a substrate section before an Al or Al—Si deposition film is formed. A substrate 90 consists of an electron donor material and is exemplified as an Si wafer. A thin film 91 consists of a non-electron donor material and is exemplified as a thermal oxidation $SiO_2$ film or a BSG film.

A chemical treatment (to be described in detail later) of the substrate is performed as a pre-treatment of deposition, so that terminal bonds of surface atoms are terminated as a hydrogen atom group.

When a gas mixture consisting of DMAH and $Si_2H_6$ as source gases and $H_2$ as a reaction gas is supplied to the substrate 90 heated to a predetermined temperature which is a decomposition temperature or more of the DMAH and 450° C. or less, Al—Si is precipitated on the substrate 90 to form an Al—Si continuous film, as shown in FIG. 1(b).

When Al—Si deposition continues, the Al—Si film is grown to the uppermost level of the thin film 91, as shown in FIG. 1(d) through a state in FIG. 1(c). When film deposition further continues, the Al—Si film can be grown to a thickness of 5,000 Å almost without extending in the lateral direction, as shown in FIG. 1(e). This growth is a characteristic feature of a deposition film formed using the combination of DMAH and H$_2$ or the combination of DMAH, H$_2$, and Si$_2$H$_6$. It can be understood that a high-quality film can be formed with good selectivity.

The resultant film does not contain impurities such as carbon and oxygen in accordance with analysis results using an Auger electron spectroscopy or photoelectron spectroscopy.

A 4,000-Å thick deposition film thus obtained has a resistivity of 2.7 to 3.0 μΩ.cm, which is almost equal to that of Al bulk at room temperature. This film is continuous and flat. Even if a deposition film has a thickness of 1 μm, its resistivity falls within the range of 2.7 to 3.0 μΩ.cm at room temperature. Therefore, even a thick deposition film can be a sufficiently dense film. The reflectance of a deposition film in a wavelength range of visible light is about 80%. A thin film having excellent surface flatness and excellent stress migration can be deposited.

In the multi-layered wiring formation of VLSIs, a technique for selectively embedding a via hole with high-quality Al or Al—Si, as shown in FIG. 1(d), is indispensable. In addition, after Al or Al—Si is selectively deposited, as shown in FIG. 1(d), if Al or Al—Si serving as an electron donor material is deposited on Al or Al—Si or a non-electron donor material (e.g., a thermal oxidation SiO$_2$ film or a CVD-BSG film) in the same reaction vessel, as shown in FIG. 1(f), a highly reliable multi-layered wiring process free from disconnections at stepped portions can be realized.

As described in detail above, by using the alkylaluminum hydride and H$_2$, in the selective growth on the electron donor surface heated to the decomposition temperature or more of the alkylaluminum hydride and 450° C. or less, excellent selectivity of the Al film can be obtained. For this reason, a technique for forming an Al film on the thin film 91 must be implemented. In consideration of this, the non-electron donor surface is modified, and an Al film which cannot be deposited on the non-electron donor surface due to its selectivity can be formed on the modified non-electron donor surface.

This surface modification can be performed by the step of supplying electrons and hydrogen to the non-electron donor substrate surface.

If this method is used, the following point in combination with the sputtering method can be improved. That is, after the CVD process, a wafer is exposed to the atmospheric air when the wafer is transferred to another sputtering apparatus. A high-resistance film containing oxygen is formed at an interface between the selectively grown Al film and a non-selectively grown Al film to increase a contact resistance to fail to realize a low-resistance wiring pattern. This drawback can be eliminated by the above method.

FIGS. 2(a) to 2(e) are views showing the steps in selective formation on an electron donor surface consisting of a non-monocrystalline material by using a combination of DMAH and H$_2$ or a combination of DMAH, Si$_2$H$_6$, and H$_2$.

An underlying material on which Al for forming a wiring electrode is formed is generally constituted by a non-monocrystalline material. More specifically, examples of the underlying material are polysilicon for forming a gate electrode or a wiring layer, a metal silicide material such as W silicide or Mo silicide for forming a polycide structure, and a W, WSi$_2$, Mo, or MoSi$_2$ barrier material for preventing diffusion of Si and Al.

The polysilicon, the metal silicide material, and the barrier metal material can be patterned into desired shapes by photolithographic techniques. An insulating film is deposited on the entire surface of the resultant structure, a contact hole is formed in this insulating film, and an electrode material is embedded in the contact hole, thereby forming a wiring layer.

According to an embodiment of the present invention, for example, as a pre-treatment of Al film deposition, the following cleaning method is performed:

(Cleaning by H$_2$SO$_4$/H$_2$O (=⅓))→(Cleaning with Water)→(Cleaning by HF/H$_2$O (=1/200))→(Cleaning with Water)→(Drying)

The cleaning time using HF/H$_2$O is 60 seconds, and final cleaning with water is performed for 6 minutes. According to the TDS method, terminal hydrogen atoms are observed on the surfaces of polysilicon, a silicide material, and a barrier material in main cleaning. Selective deposition of Al by using DMAH can be performed on the basis of the mechanism described above.

FIG. 2(a) is a view illustrating a substrate section before formation of an Al or Al—Si deposition film. A substrate 90 consists of an electron donor material and is exemplified by an Si wafer. A thin film 91 consists of a non-electron donor material and is exemplified by a thermal oxidation SiO$_2$ film or a BSG film.

Figure 2B:
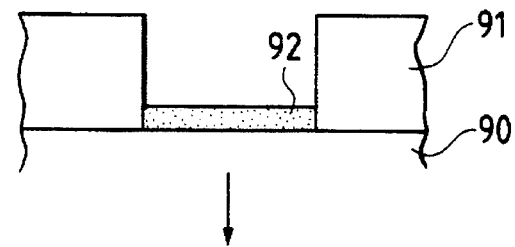

As shown in FIG. 2(b), polycrystalline W is selectively deposited in a hole by using WF$_6$ gas. A chemical treatment of the substrate is performed as a pre-treatment, and the surface of the W film 92 is terminated with a hydrogen atom group.

Figure 2C:
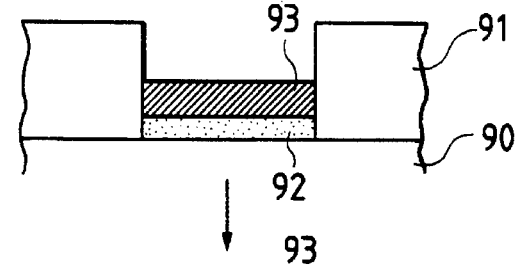

When a gas mixture consisting of DMAH and Si$_2$H$_6$ as source gases and H$_2$ as a reaction gas is supplied to the substrate 90 heated to a predetermined temperature which is a decomposition temperature or more of the DMAH and 450° C. or less, Al—Si is precipitated on the substrate 90 to form an Al—Si continuous film 93, as shown in FIG. 2(c).

Figure 2D:
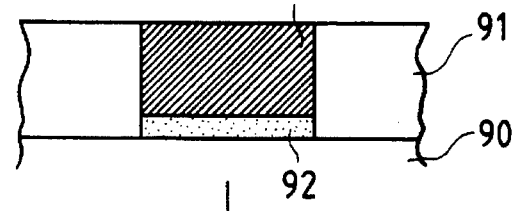
Figure 2E:
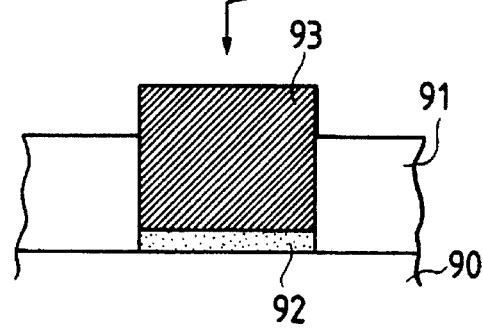

When Al—Si deposition continues, the Al—Si film is grown to the uppermost level of the thin film 91, as shown in FIG. 2(d) through a state in FIG. 2(c). When film deposition further continues, the Al—Si film can be grown to a thickness of 5,000 Å almost without extending in the lateral direction, as shown in FIG. 2(e). This growth is a characteristic feature of a deposition film formed using the combination of DMAH and H$_2$ or the combination of DMAH, H$_2$, and Si$_2$H$_6$. It can be understood that a high-quality film can be formed with good selectivity.

The resultant film does not contain impurities such as carbon and oxygen in accordance with analysis results using an Auger electron spectroscopy or photoelectron spectroscopy.

A 4,000-Å thick deposition film thus obtained has a resistivity of 2.7 to 3.0 μΩ.cm, which is almost equal to that of Al bulk at room temperature. This film is continuous and flat. Even if a deposition film has a thickness of 1 μm, its resistivity falls within the range of 2.7 to 3.0 μΩ.cm at room temperature. Therefore, even a thick deposition film can be a sufficiently dense film. The reflectance of a deposition film in a wavelength range of visible light is about 80%. A thin film having excellent surface flatness and excellent stress migration can be deposited.

Figure 2F:
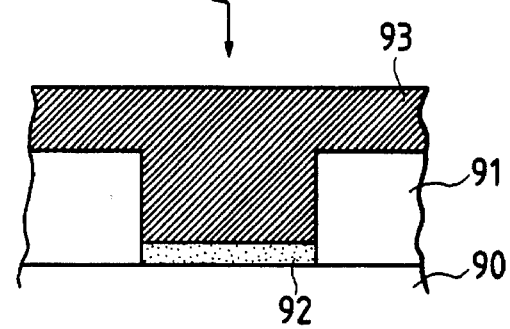

In the multi-layered wiring formation of VLSIs, a technique for selectively embedding a via hole with high-quality Al or Al—Si, as shown in FIG. 2(d), is indispensable. In addition, after Al or Al—Si is selectively deposited, as shown in FIG. 2(d), if Al or Al—Si serving as an electron donor material is deposited on Al or Al—Si or a non-electron donor material (e.g., a thermal oxidation SiO$_2$ film or a CVD-BSG film) in the same reaction vessel, as shown in FIG. 2(f), a highly reliable multi-layered wiring process free from disconnections at stepped portions can be realized.

As described in detail above, by using the alkylaluminum hydride and H$_2$, in the selective growth on the electron donor surface heated to the decomposition temperature or more of the alkylaluminum hydride and 450° C. or less, excellent selectivity of the Al film can be obtained. For this reason, a technique for forming an Al film on the thin film 91 must be implemented. In consideration of this, the non-electron donor surface is modified, and an Al film which cannot be deposited on the non-electron donor surface due to its selectivity can be formed on the modified non-electron donor surface.

This surface modification can be performed by the step of supplying electrons and hydrogen to the non-electron donor substrate surface.

If this method is used, the following point in combination with the sputtering method can be improved. That is, after the CVD process, a wafer is exposed to the atmospheric air when the wafer is transferred to another sputtering apparatus. A high-resistance film containing oxygen is formed at an interface between the selectively grown Al film and a non-selectively grown Al film to increase a contact resistance to fail to realize a low-resistance wiring pattern. This drawback can be eliminated by the above method.

In addition, according to the present invention, Al or Al—Si shown in FIG. 2(f) can be deposited by one CVD apparatus.

The function of the present invention is as follows. Deposition is performed to fill the via hole using the combination of DMAH and $H_2$ or the combination of DMAH, $Si_2H_6$, and $H_2$, as shown in FIGS. 2(a) to 2(e). The surface of the non-electron donor surface is modified into a substantially electron donor material surface. Al or Al—Si is uniformly deposited on the Al or Al—Si surface serving as the electron donor material and the modified non-electron donor material as the electron donor material. The surface modification is to modify even a non-electron donor surface such that free electrons are present and contribute to a surface reaction. For example, there is a method of supplying free electrons to the surface by a plasma process, ion radiation, or electron beam radiation. Another method is also available in which light having an energy higher than that of a forbidden band width of $SiO_2$ is radiated on $SiO_2$ to produce free electrons on the non-electron donor surface.

When an RF plasma is generated while DMAH and $H_2$ are kept supplied, electrons are supplied from the plasm to a non-electron donor surface. When the electrons are supplied to this surface, $H_2$ molecules are dissociated into H atoms, as is well known, to react with the DMAH present on the non-electron donor surface and continuous flowing thereon, thereby depositing an Al film. Alternatively, H atoms and electrons may be directly supplied from the $H_2$ plasma to the surface of the non-electron donor surface and are reacted with the DMAH to form an Al film. According to an assumption to be described later, DMAH must contain asymmetric molecules. Since the DMAH molecules have a reaction group $CH_3$ for causing a surface reaction on the modified surface and a heredity radical H (for forming a surface equivalent to a modified surface) indispensable to continuation of the reaction, deposition by the reaction on the substrate surface and continuation of the reaction can be performed.

An electron density in the plasma near the substrate surface subjected to surface modification falls within the range of $1\times10^8$ cm$^{-3}$ to $8\times10^{10}$ cm$^{-3}$, and more preferably $5\times10^8$ cm$^{-3}$ to $2\times10^9$ cm$^{-3}$ near the substrate surface. A plasma power density preferably falls within the range of 0.04 to 0.4 W/cm$^3$. An area near the substrate surface includes a 1-cm deep area from the substrate surface. More specifically, the electron density at the center of the plasma is $1\times10^{10}$ cm$^{-3}$ and that near the substrate surface is $1\times10^8$ cm$^{-3}$. The electron density is measured by a known TDS or HEELS method. The electron density of the present invention is determined by such a method.

Figure 3:
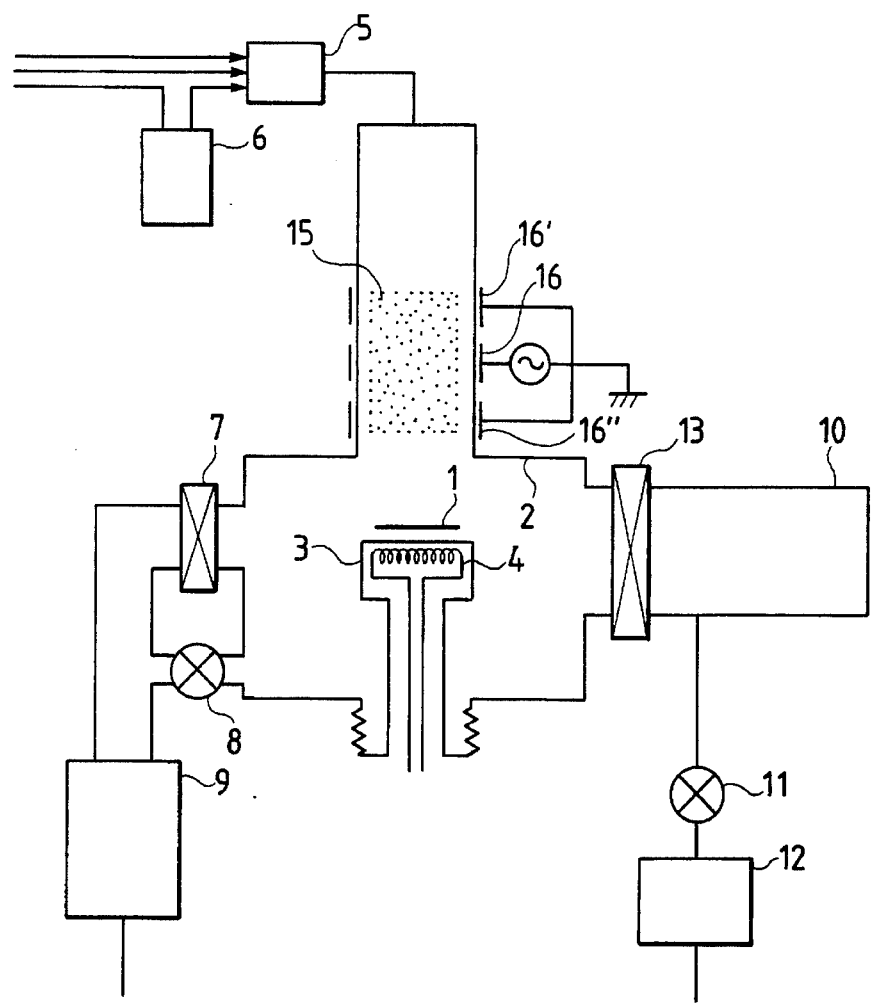
FIG. 3 is a view showing a metal film formation apparatus preferably applied to the present invention.

FIG. 3 is a view showing a deposition film formation apparatus which can be applied to the present invention.

An Al—Si film is to be formed on a substrate 1. The substrate 1 is placed on a substrate holder 3 arranged inside a reaction tube or chamber 2 for forming a substantially closed deposition film formation space. A material for forming the reaction tube 2 is preferably quartz, but may be a metal. If a metal is used to form the reaction tube 2, the reaction tube 2 is preferably cooled. The substrate holder 3 is made of a metal and incorporates a heater 4 to heat the substrate placed thereon. The temperature of the heater 4 is controlled in order to control the substrate temperature.

A gas supply system 56 is arranged as follows.

Figure 4:
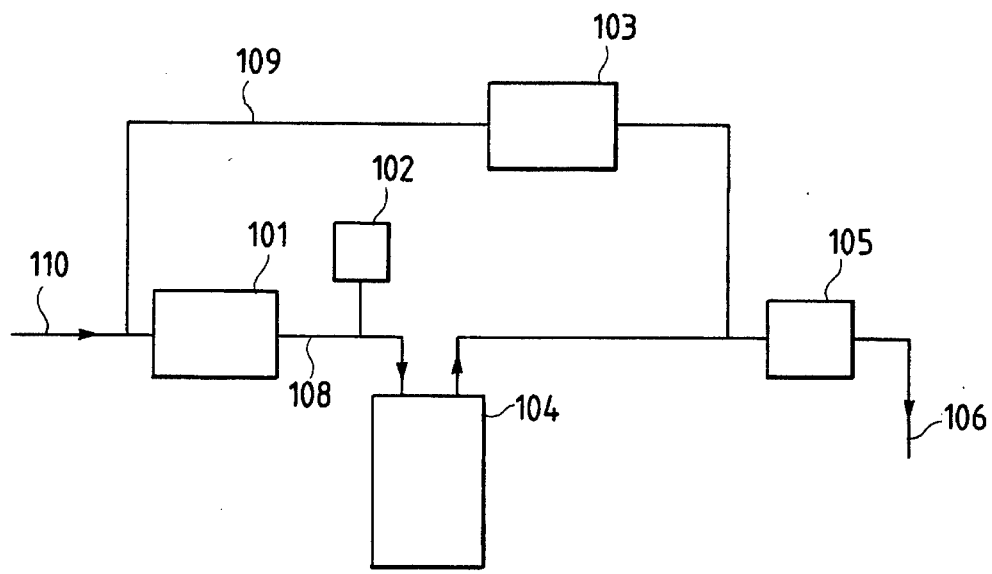
FIG. 4 is a view showing a gas supply system in the metal film formation apparatus preferably applied to the present invention.

According to the present invention, a supply system using low-pressure bubbling is preferably employed to change a partial pressure of DMAH. A gas supply unit using the low-pressure bubbling is shown in FIG. 4.

Hydrogen gas supplied from a supply gas line 110 is supplied to a bubbler 104 through a supply gas main line 108 after the flow rate of the hydrogen gas is controlled by a flow control unit 101. The bubbler 104 contains DMAH or the like. The hydrogen gas containing DMAH is supplied to a reaction tube 106 through a pressure control unit 105. Since the vapor pressure of the DMAH at 1 atm. and room temperature is known as about 2 Torr, a partial pressure $P_{DMAH}$ of the DMAH is defined as follows:

$$P_{DMAH}=P_{TOT}\times 2/P_2$$

where $P_{TOT}$ is the total pressure within the reaction tube, and $P_B$ is the pressure inside the bubbler 104.

The predetermined partial DMAH pressure which can achieve the object of the present invention can be obtained on the basis of the above equation. For example, the total pressure $P_{TOT}$ of the reaction chamber is set to be 1.5 Torr, the pressure $P_B$ inside the bubbler 104 is controlled to be 100 Torr by the pressure control unit 105, so that the partial pressure $P_{DMAH}$ of the DMAH supplied to the reaction chamber is set to be $3\times10^{-2}$ Torr by the above equation. In this manner, the internal pressure $P_B$ of the bubbler can be increased about 10 times 1 atm. Similar control operations are performed to change the internal pressure $P_B$ of the bubbler in the range of 760 Torr to 14 Torr, so that the partial pressure of the DMAH can be changed in the range of $4.0\times10^{-3}$ to $2.1\times10^{-1}$ Torr.

The partial pressure of the DMAH can be reduced as follows. As shown in FIG. 4, the internal pressure of the bubbler is set close to 1 atm., and hydrogen gas from the supply gas line 110 is partially supplied to a supply gas bypass line 109. This hydrogen gas is supplied to the reaction tube 106 together with hydrogen gas supplied from a supply gas main line 108 containing DMAH, thereby substantially reducing the partial pressure of the DMAH. The partial pressure of the DMAH can be controlled by a hydrogen flow rate ratio of the hydrogen flowing through the main line 108 to that flowing through the bypass line 109.

An evacuation system has the following arrangement.

A gate valve 7 is opened to perform large-capacity evaluation as in evaluation of the interior of the reaction tube 2 prior to formation of the deposition film. A slow leak valve 8 is used to perform small-capacity evaluation as in adjustment of the internal pressure of the reaction tube 2 during formation of the deposition film. An evacuation unit 9 is constituted by an evacuation pump such as a turbo molecular pump.

A convey system of the substrate 1 is arranged as follows.

A substrate convey chamber 10 can store a substrate before and after formation of the deposition film. The substrate convey chamber 10 can be evacuated by opening a valve 11. An evacuation unit 12 is used to evacuate the convey chamber 10 and is constituted by an evacuation pump such as a turbo molecular pump.

A valve 13 is open during only transfer of the substrate 1 between the reaction chamber and the convey space.

An electrode 16 serving as a plasma generating means is arranged around the reaction chamber 2. An AC power source 14 is connected to the electrode 16 to generate a plasma.

As shown in FIG. 3, in a gas generation chamber for generating the first source gas, the liquid DMAH held at room temperature is bubbled with $H_2$ or Ar (or any other inert gas) as a carrier gas to produce gaseous DMAH. The DMAH gas is then supplied to a mixer 14. $H_2$ as the reaction gas is supplied to the mixer 14 through another supply path. The flow rates of these gases are controlled so that the respective partial pressures are set to be predetermined pressures.

$MMAH_2$ may be used as the first source gas. However, DMAH having a vapor pressure set to be 1 Torr at room temperature is most preferable. A mixture of DMAH and $MMAH_2$ may be used.

Examples of the Si-containing gas as the second source gas for forming an Al—Si film are $Si_2H_6$, $SiH_4$, $Si_3H_6$, $Si(CH_3)_4$, $SiCl_4$, $SiH_2Cl$, and $SiH_3Cl$. Among them all, $Si_2H_6$ is most preferable because it tends to be decomposed at a low temperature of 200° to 300° C. In addition, $Si_2H_6$ gas diluted with $H_2$ or Ar is obtained by supplying DMAH to the mixer through another flow path and is supplied to the reaction tube 2.

When a gas is used for surface modification, an Si-containing gas or a Ti-containing gas such as $TiCl_4$ is supplied to the mixer through a pipe different from those for the DMAH and the Si-containing gas, and the resultant gas is supplied from the mixer to the reaction tube 2.

When a gas mixture consisting of DMAH and $Si_2H_6$ as source gases and $H_2$ as a reaction gas is supplied to the substrate 90 heated to a predetermined temperature which is a decomposition temperature or more of the DMAH and 450° C. or less, Al—Si is precipitated on the substrate 90 to form an Al—Si continuous film, as shown in FIG. 1(b).

When Al—Si deposition continues, the Al—Si film is grown to the uppermost level of the thin film 91, as shown in FIG. 1(d) through a state in FIG. 1(c). The selectively deposited pure Al film is of monocrystalline.

The "surface modification process" which causes a surface reaction on the non-electron donor surface is performed while DMAH and $Si_2H_6$ are kept supplied. DMAH and $Si_2H_6$ are then kept supplied to deposit Al or Al—Si in a shape shown in FIG. 1(f).

As described above, the substrate is preferably kept at the predetermined temperature which is the decomposition temperature or more of the Al-containing source gas and 450° C. or less. More specifically, the substrate temperature preferably falls within the range of 200° to 450° C. When deposition is performed under this condition, the deposition rate is as very large as 1,000 Å/min to 3,000 Å/min when the partial pressure of the DMAH is the internal pressure of the reaction vessel of $7\times10^{-3}$ to $9\times10^{-2}$ Torr. A high deposition rate in a VLSI Al—Si deposition technique can be obtained.

The substrate temperature more preferably falls within the range of 270° C. to 350° C., and orientation of the Al—Si film deposited under this condition is uniform. Even if annealing at 450° C. for 1 hour is repeated several tens of times, hillocks and spikes are not formed on Al—Si films on a monocrystalline silicon substrate or a polysilicon substrate, thereby obtaining a high-quality Al—Si film. This Al—Si film is excellent in electromigration durability.

The surface modification process is performed as follows. An $H_2$ plasma is generated by RF power in an $H_2$ atmosphere in the reaction tube. H atoms and electrons are supplied from the plasma to the non-electron donor surface to modify the non-electron donor surface to a substantially electron donor surface, thereby allowing deposition shown in FIG. 1(f). Ground electrodes 16' and 16" are arranged as plasma generation electrodes in addition to the electrode 16. In the surface modification process, an RF power having a frequency of about 13.56 MHz is applied to the electrode 16 to generate a plasma. Since the electrode 16 is interposed between the ground electrodes 16' and 16", lines of electric force from the excitation electrode 16 are terminated at the ground electrodes 16" and 16', thereby minimizing damage to the substrate 1 by the plasma. Al or Al—Si is selectively deposited on the electron donor surface of the substrate having the electron donor surface and the non-electron donor surface, and a plasma is generated while the combination of DMAH and $H_2$ or the combination of DMAH, $H_2$, and $Si_2H_6$ are kept supplied. The electrons and hydrogen atoms are supplied from the plasma to the non-electron donor surface to perform surface modification. After the surface modification is completed, the plasma is stopped, and deposition is continued.

When the plasma power and the electron density are excessively high, the DMAH is excited and decomposed to produce a large nucleus having Al as a major constituent in the surface modification process, thereby greatly degrading the surface morphology. However, when the plasma power and the electron density are excessively low, supply of the electrons and hydrogen atoms becomes insufficient, thereby reducing the surface modification effect. The pressure of the reaction tube during surface modification falls within the range of 0.1 to 5 Torr, the plasma generation power falls within the range of 0.04 to 0.4 W/cm$^{-3}$ in the apparatus shown in FIG. 4, the surface modification time is 10 sec or more, and the electron density of the plasma near the substrate surface falls with the range of $5\times10^8$ cm$^{-3}$ to $2\times10^9$ cm$^{-3}$.

After the non-electron donor surface is modified, Al is non-selectively deposited on the electron donor surface and the modified non-electron donor surface. At this time, no carbon is detected on the Al or Al—Si selectively deposited on the electron donor surface and the Al or Al—Si non-selectively deposited on the electron donor surface and the modified non-electron donor surface. Upon completion of the surface modification process, even if deposition can be continued without stopping generation of the plasma, no problem is posed. The film quality of the Al or Al—Si deposited while generating the plasma is almost equal to that of the film deposited without any plasma. The density of the plasma power applied during the surface modification is smaller than a plasma power used in conventional CVD or conventional reactive ion etching. For this reason, almost no material is deposited on the inner wall surface of the reaction tube.

In the apparatus shown in FIG. 3, the 13.56-MHz RF power source is used to generate the plasma. However, a DC, commercial frequency, or microwave (e.g., 2.45 GHz) power may be used to perform an electric discharge.

Selective growth is determined such that a reaction for forming a desired film is formed on a substrate surface.

Whether selective growth occurs or not can be described by a difference in adsorption point on the substrate surface. When selectivity is exhibited by the difference in adsorption point, e.g., when the growth time is prolonged or the deposition temperature is increased, deposition selectivity is impaired.

Examples of conventional selective growth are reported such that Si and W are grown on an Si substrate surface, but are not deposited on $SiO_2$.

In these examples of selective growth, however, when the growth time is undesirably prolonged and the deposition temperature is increased, Si and W nuclei are formed on SiOn, thereby impairing deposition selectivity, as is well known.

In order to apply selective growth to a VLSI process, a deposition film must have high quality, and good selectivity must be obtained. That is, nuclei and the like should not be formed on a surface free from film deposition.

In Al deposition associated with the present invention, Al is deposited on the electron donor surface, but no Al nucleus is formed on the non-electron donor surface, thereby obtaining excellent selectivity.

An Al deposition reaction can be represented by formula (1) as a whole. It is difficult to expect from only equation (1) whether selective growth occurs. Excellent selectivity of the present invention can be readily understood when the reaction represented by formula (1) is microscopically observed.

It is also readily understood that monocrystalline Al can be deposited on a monocrystalline Si substrate in an embodiment to be described below. The reaction represented by formula (1) will be exemplified by Al deposition on a monocrystalline Si substrate.

Figure 5:
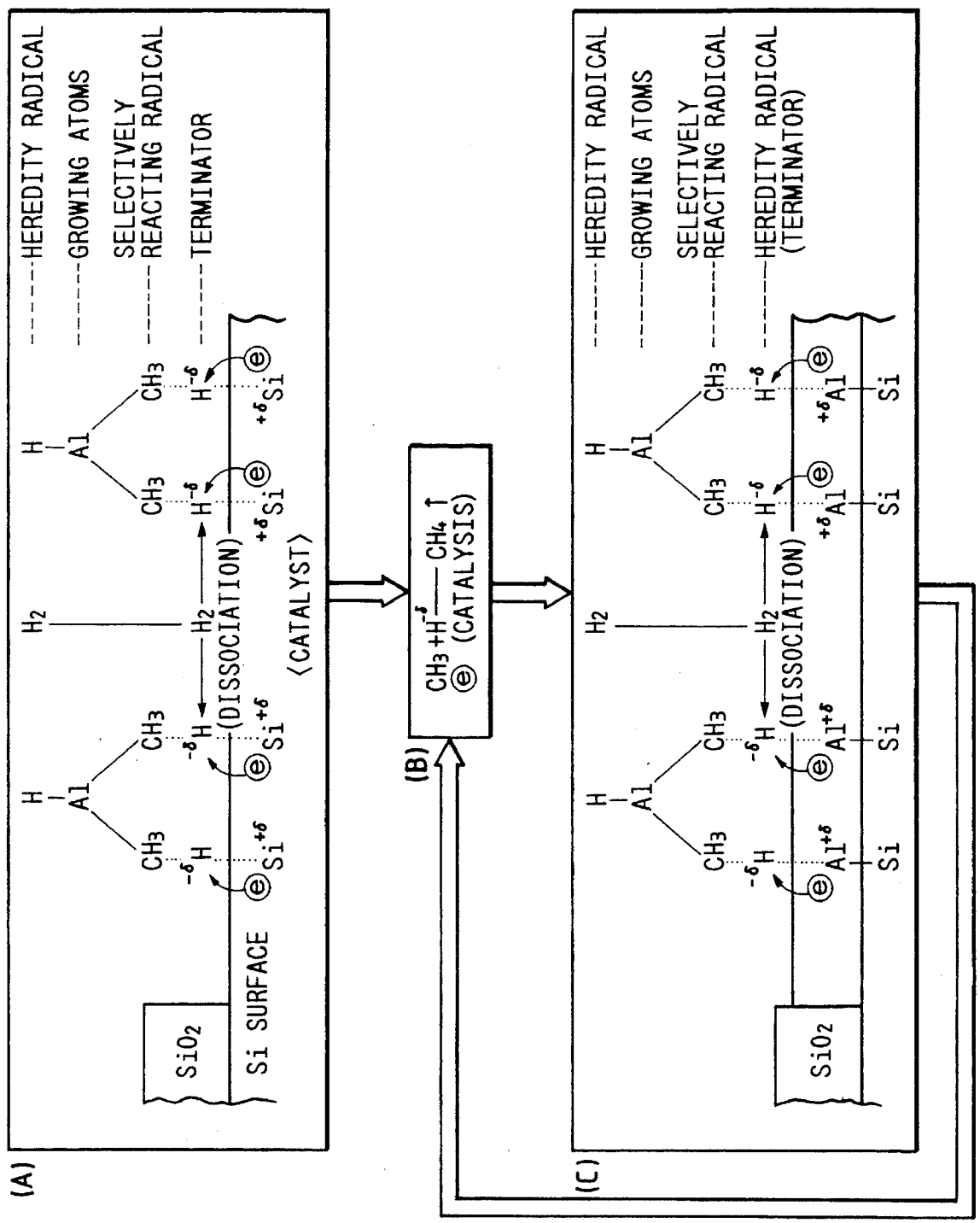
FIG. 5 is a view for explaining an Al selective growth mechanism.

Cleaning using an ammonia-based solution and a treatment using sulfuric acid-based chemicals are generally performed, and the resultant structure is dipped in a diluted hydrofluoric acid solution. The structure is removed from the diluted hydrofluoric acid solution and is cleaned with water. In this cleaning process, the Si surface is terminated with H atoms, as indicated by formula (A) in FIG. 5. Si and O bonds on the $SiO_2$ surface are closed, and H atoms are not terminated.

Si-H forms an electric double layer due to electron movement since electronegativity of Si is less than that of H as follows:

$$Si^{+\delta}-H^{-\delta}$$

When the substrate is heated in the deposition space and DMAH and $H_2$ are supplied, $H_2$ is dissociated on the Si surface into H atoms, so that the H atoms are terminated to uncombined Si on the Si surface.

It is important that not $H_2$ molecules but the H atoms are terminated on the Si surface.

DMAH has a dimer structure at room temperature, but is heated and converted into a monomer on the substrate, so that DMAH is adsorbed in the substrate surface. More specifically, the DMAH is adsorbed such that the $CH_3$ group is located on the substrate surface side, as indicated by formula (A) of FIG. 5.

The Al-$CH_3$ bond is said to be weakened in the presence of free electrons on a surface where the free electrons are present. It is known in the chemical field that the $CH_3$ group is reacted with the H atoms at the zero activation energy level to produce $CH_4$ by reaction formula (B) of FIG. 5 (to be referred to as a methanization reaction hereinafter). The terminated H atoms on the Si surface are given as follows:

$$H^{-\delta}$$

and tend to be reacted with the $CH_3$ having a small electron affinity.

In addition, the methanization reaction tends to occur by a catalyst function of the free electrons present on the surface.

The $CH_3$ group is reacted with $H_2$ molecules to produce $CH_4$. However, in the following reactions represented by the following formulas:

$$CH_3+H \text{ (atom)} \rightarrow CH_4$$

$$CH_3+\tfrac{1}{2}H_2 \text{ (molecule)} \rightarrow CH_4$$

the reaction speeds are different from each other by ten times or more. The CH3 group is reacted with the H atoms to cause the methanization reaction. Al is deposited on Si as the electron donor substrate through the reactions represented by formulas (A) and (B) in FIG. 5. At this time, it is important that the source gas DMAH has the $CH_3$ group which tends to be selectively reacted with the terminated atoms on the substrate surface. When Al is deposited through the reactions represented by formulas (A) and (B) of FIG. 5, the Al surface is set in a state wherein the H atoms are terminated, as indicated by formula (C) in FIG. 5. This state is the same as the initial state represented by formula (A) in FIG. 5. Since free electrons are present in Al, the $H_2$ molecules are dissociated into H atoms, and the Al surface can be terminated with H.

Al deposition continuously occurs by DMAH adsorption and the methanization reaction.

After Al is deposited, the state in which the H atoms are terminated on the Si surface is generically preserved. The H atoms for terminating the Al surface upon deposition of Al are H atoms in the DMAH. The H atoms in the DMAH can be called a heredity radical capable of maintaining the terminated state. The CH3 in the DMAH can be called a selectivity reacting radical for selectively reacting with the atoms terminated on the surface.

In fine, the Al deposition reaction is caused by a selective reaction between the H atoms terminated on the surface and the $CH_3$ group in the DMAH. Supply of the terminating H atoms is achieved by dissociation of $H_2$ molecules on the electron donor substrate surface on which free electrons are present. At the same time, supply of terminating H atoms is achieved by free electrons on the electron donor substrate surface which cause the methanization reaction.

A non-electron donor substrate surface such as an $SiO_2$ surface is not terminated with H atoms. Free electrons are not present on the non-electron donor substrate surface. Even if a large number of $H_2$ molecules are supplied to this surface, neither dissociation occurs nor a terminated state is obtained. In this manner, since the free electrons are present, the Al—$CH_3$ bond is not weakened, and the reaction $CH_3$+H→$CH_4$ does not occur. Therefore, since the terminated H atoms for causing Al deposition and the free electrons for causing the above reaction are not present, no Al deposition occurs on the non-electron donor substrate.

Unlike a conventionally known reaction based on a difference in adsorption points, in the DMAH+$H_2$ system, since the Al deposition reaction is supported by two factors, i.e., the terminated H atoms and the free electrons, deposition selectivity is excellent. Since the H atoms are left to be terminated on the Al surface, Al selective growth can have directivity. That is, Al can be grown vertically without being deposited laterally, as shown in FIG. 1(f).

The above reaction is apparently caused by the terminated state of the surface and the free electrons for causing the reaction. The structure of the DMAH molecule is also a characteristic feature in which different groups such as $CH_3$ group and the H atoms are bonded around Al atoms. DMAH molecules (i.e., the growing atoms constituting the deposition film) in which different materials, i.e., the $CH_3$ group and the H atoms, are bonded to the Al molecules are called asymmetrical molecules.

Al growth on monocrystalline silicon is taken into consideration again. As described above, when the Si surface is chemically treated, the surface is terminated with H atoms. It should be noted that the H atoms terminated on the monocrystalline Si are two-dimensionally, regularly aligned. Therefore, Al deposited on monocrystalline Si becomes of monocrystalline.

In a metal such as Al constituting an electron donor substrate or the like on which free electrons are present, the surface is terminated with H atoms by the terminated H atoms dissociated from $H_2$ molecules in the presence of free electrons or by dissociation/adsorption of the H atoms as in W having d electrons. Therefore, Al is deposited on only the electron donor substrate by the reactions represented by formulas (A), (b), and (C) in FIG. 5.

In the field of organic metallurgy, a lot of known studies on decomposition of organic metals and reactions using organic metals as catalysts have been made. However, precipitation of metal atoms of an organic metal on a desired substrate is not disclosed. The reaction according to the present invention is based on the facts that free electrons are present on the substrate surface, and the terminated state on the substrate surface is hereditarily preserved. Therefore, this reaction is fundamentally different from the conventional decompositions and reactions of organic metals.

A film obtained by an Al or Al—Si film formation method according to the present invention is dense and has a very small amount of impurities such as carbon. The film has a resistivity almost equal to the bulk and has a high flatness. The film has the following typical effects:

① A decrease in generation of hillocks during annealing;

② Improvement of anti-electromigration;

③ A decrease in alloy pits in a contact portion;

④ Improvement of wiring patterning by improvement of surface smoothness;

⑤ Decreases in resistance in a via hole and in contact resistance; and

⑥ Low-temperature annealing during wiring.

According to the method disclosed by the present invention, a deposition film can be selectively formed in a recess in a substrate having surface roughness on a micron or submicron order and having an electron donor material and a non-electron donor material. A uniform Al film can be formed on the entire substrate within the same film formation apparatus.

In the multi-layered wiring layer formation process for VLSIs, a decrease in thickness of a metal thin film on the rough surface degrades the reliability of the device. According to the method of depositing the Al or Al—Si film according to the present invention, a decrease in film thickness on the rough surface is small, and a highly reliable Al or Al—Si film can be formed.

It is difficult to form a uniform film on a rough surface by the conventional sputtering method. For this reason, a wall portion of an opening formed in an insulating film is inclined by a technique such as a reflow technique using, e.g., high-temperature annealing.

However, when the inclined wall surface is formed in the opening, an unnecessary area is required contrary to micropatterning.

According to the present invention, Al or Al—Si is embedded in a via hole having a vertical wall, and an Al film formed thereafter has excellent flatness.. Therefore, the method of the present invention is ideal as a method of depositing a metal wiring layer for a micropatterned VLSI.

The chemical pre-treatment of the substrate prior to deposition will be as follows:

a) "Cleaning with $NH_4OH+H_2O_2+H_2O$, subsequent cleaning with water, subsequent cleaning with $HF/H_2O=1/40$, and subsequent cleaning with water"; or b) "Cleaning with $H_2SO_4/H_2O_2=3/1$, subsequent cleaning with water, subsequent cleaning with $HF/H_2O=1/40$, and subsequent cleaning with water".

In this pre-treatment, the substrate surface is terminated with H and F atoms. Final cleaning with water can eliminate most of the F atoms. A stable state can be obtained in which H atoms are terminated on the substrate surface. Deposition was performed in the following examples using the pre-treated substrates.

Example 1

Procedures for forming an Al film will be described below.

The surface of a monocrystalline Si substrate is thermally oxidized and is patterned to form a hole. A thin polycrystalline W film is formed in the hole by a selective CVD method using $WF_6$. Thereafter, the chemical pre-treatment described above is performed.

By using the apparatus shown in FIG. 3, the reaction tube 2 is evacuated to about $1\times10^{-8}$ Torr by the evaluation unit 9. Note that Al is grown even if the degree of vacuum in the reaction tube 2 is less than $1\times10^{-8}$ Torr.

The Si wafer having the W film described is cleaned with the chemical pre-treatment. The convey chamber 10 is set at the atmospheric pressure to load the Si wafer in the convey chamber. The convey chamber is evacuated to about $1\times10^{-6}$ Torr, the gate valve 13 is opened, and the wafer is held in the wafer holder 3.

After the wafer is held in the wafer holder 3, the gate valve 13 is closed, and the reaction chamber 2 is evacuated to about $1\times10^{-8}$ Torr.

In this example, DMAH is supplied from the first gas line. A carrier gas for the DMAH line is $H_2$. The second gas line is used for $H_2$.

$H_2$ is supplied from the second line and the opening degree of the slow leak valve 8 is controlled to set the internal pressure of the reaction tube 2 to a predetermined value. A typical pressure in this example is about 1.5 Torr. Thereafter, the heater 4 is energized to heat the wafer. When the wafer temperature reaches a predetermined temperature, DMAH is supplied from the DMAH line to the reaction tube. The total pressure is about 1.5 Torr, and the partial pressure of DMAH is set to be about $1.5\times10^{-4}$ Torr. When this DMAH is supplied to the reaction tube 2, Al is deposited. This Al film is defined as the first Al film.

When a predetermined deposition time has elapsed, a voltage is applied from an RF (13.56 MHz) power source to the excitation electrode 16 without interrupting DMAH supply, thereby generating an $H_2$ plasma. Ring-like electrodes are arranged to interpose the ring-like electrode applied with the RF power and are set at the ground potential, so that the plasma can be properly shaped. The decomposition reaction is performed by a plasma by an RF power of 20 W, an electron density of $1\times10^9$ cm$^3$ near the substrate surface, and an electron temperature of 6.5 eV near the substrate surface. That is, the hydrogen atoms and the electrons are supplied from the plasma to the substrate, thereby performing a surface modification process. Upon radiation of the plasma for one minute, RF supply is stopped. When DMAH and $H_2$ are kept supplied, Al is deposited on the deposited Al film and the $SiO_2$ film. When a predetermined deposition time has elapsed, supply of the DMAH is stopped. An Al film deposited in this process is defined as the second Al film.

In the above sample, in the temperature range of 160° C. to 450° C., in the first Al film deposition process, Al is not deposited on $SiO_2$, but Al is deposited on only the Si-exposed portion to a thickness equal to that of $SiO_2$. In the second Al film deposition process, Al is deposited on both the first Al film and $SiO_2$ at the same deposition rate. The heater 4 is stopped, and the wafer is cooled. Supply of the $H_2$ gas is stopped, and the reaction vessel is evacuated. The wafer is transferred to the convey chamber. Only the convey chamber is set at the atmospheric pressure, and the wafer is unloaded. These procedures are steps in forming an Al film.

Samples of this example will be formed below.

The conditions in the first Al film deposition process, the surface modification process, and the second Al film deposition process are as follows.

| First Al Film Deposition Process | |
|---|---|
| Total Pressure | 1.5 Torr |
| Partial Pressure of DMAH | $1.5 \times 10^{-4}$ Torr |
| Surface Modification Process | |
| Total Pressure | 1.5 Torr |
| Partial Pressure of DMAH | $1.5 \times 10^{-4}$ Torr |
| RF Power | 20 W |
| Surface Electron Density | $1 \times 10^9$ cm$^{-3}$ |
| Plasma Radiation Time | 1 minute |
| Second Al Film Deposition Process | |
| Total Pressure | 1.5 Torr |
| Partial Pressure of DMAH | $1.5 \times 10^{-4}$ Torr |

The resultant Al films deposited at 13 different substrate temperatures were evaluated by various evaluation methods. Results are shown in Table 1.

TABLE 1

| Evaluation Item | Substrate Temperature (°C.) | | | | | | | | | | | | |
|---|---|---|---|---|---|---|---|---|---|---|---|---|---|
| | 150 | 160 | 200 | 250 | 270 | 300 | 330 | 350 | 370 | 400 | 430 | 450 | 470 |
| Carbon Content (%) | — | 0 | 0 | 0 | 0 | 0 | 0 | 0 | 0 | 0 | 0 | 0 | 1 to 9 |
| Resistivity (μΩ · cm) | — | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 |
| Reflectance (%) | — | 85 to 95 | 85 to 95 | 85 to 95 | 85 to 95 | 85 to 95 | 85 to 95 | 85 to 95 | 85 to 95 | 70 to 95 | 60 or less | 60 or less |
| Average Wiring Service Life (hour) | — | $10^3$ to $10^4$ | $10^3$ to $10^4$ | $10^3$ to $10^4$ | $10^3$ to $10^4$ | $10^3$ to $10^4$ | $10^3$ to $10^4$ | $10^3$ to $10^4$ | $10^3$ to $10^4$ | $10^2$ to $10^3$ | $10^2$ to $10^3$ | $10^2$ to $10^3$ |
| Deposition Rate (Å/min) | — | 1 to 9 | 100 to 800 | 100 to 800 | 100 to 800 | 100 to 800 | 100 to 800 | 100 to 800 | 100 to 800 | 100 to 800 | 100 to 800 | 100 to 800 | 1000 |
| Hillock Density (cm$^{-2}$) | — | 0 to $10^3$ | 0 to $10^3$ | 0 to $10^3$ | 0 to 10 | 0 to 10 | 0 to 10 | 0 to 10 | 0 to $10^4$ | 0 to $10^4$ | 0 to $10^4$ | 0 to $10^4$ | 0 to $10^4$ |
| Spike Generation Rate (%) | — | 0 to 10 | 0 to 10 | 0 | 0 | 0 | 0 | 0 | 0 to 30 | 0 to 30 | 0 to 30 | 0 to 30 | 0 to 30 |

(Notes)
No deposition occurs at a substrate temperature of 150° C.
The average wiring service life is defined as a period for wiring disconnection when a current having a current density of $1 \times 10^6$ of A/cm$^2$ is supplied to a 1-μm sectional area at 250° C.
The spike generation rate is defined as a breakdown probability of a junction having a depth of 0.10 μm.

An Si substrate (n-type; 1 to 2 μΩ.cm) was thermally oxidized at a temperature of 1,000° C. according to a hydrogen combustion system ($H_2$: 41/M; $O_2$: 21/M).

The film thickness fell within the range of 7,000 Å±500 Å, and the refractive index was 1.46. A photoresist was applied to the entire surface of the Si substrate, and a desired pattern was printed by a stepper. This pattern had various holes having sizes ranging from 0.25 μm×0.25 μm to 100 μm×100 μm. The photoresist was developed to obtain a photoresist pattern, and underlying $SiO_2$ was etched using the photoresist pattern as a mask by reactive ion etching (RIE), thereby partially exposing the Si substrate. 130 samples having holes which had various sizes ranging from 0.25 μm×0.25 μm to 100 μm×100 μm and were formed in $SiO_2$ were prepared. W barrier metal layers each having a thickness of about 500 Å were formed on the respective samples by a CVD method using $WF_6$. Following the same procedures as described above, Al was deposited on these 130 samples at 13 different substrate temperatures in units of ten samples.

In the above samples, in the temperature range of 160° C. to 450° C., Al was selectively deposited on only the Si-exposed portions to have the same thickness as that of $SiO_2$ in the first Al deposition process. In the second Al film deposition process, Al was deposited on both the Al film deposited in the first Al film deposition process and the $SiO_2$ surface at the same deposition rate.

The Al film selectively formed on Si and the Al film deposited on $SiO_2$ upon surface modification had identical film quality in resistivity, reflectance, and hillock generation density upon annealing.

An increase in resistance at the interface between the first and second Al films did not occur.

Example 2

In a pre-treatment prior to deposition, "Cleaning by $H_2SO_4/H_2O_2$ (=3/1))+(Cleaning with Water)+(Cleaning by $HF/H_2O$ (=1/40))+(Cleaning with Water)" described above was performed. At this time, the final cleaning with water for a time T was changed to deposit Al following the same procedures as in Example 1.

Results are shown in Table 2 below.

TABLE 2

| Time T (min.) | Peak-to-Peak Distance of Al | Si/SiO$_2$ Selectivity |
|---|---|---|
| 0 | 1500 Å PP | Formation of Al Nucleus on Si |
| 3 | 105 Å PP | Good |
| 5 | 89 Å PP | Good |
| 7 | 110 Å PP | Good |
| 10 | 94 Å PP | Good |
| 15 | 270 Å PP | Good |
| 18 | 800 Å PP | Good |
| 20 | 1125 Å PP | Good |

In the above results, the substrate surface upon cleaning with HF in the pre-treatment was set to be terminated with the H and F atoms. A sample which was not finally sufficiently cleaned with water (T=0 minutes) had a thicker spontaneous oxide film on Si than those of other samples. When the final cleaning with water appropriately ranged from 3 to 15 minutes, only F atom bonds were eliminated, and the H atoms which contributed to the reaction tended to be terminated, thereby selectively growing Al.

When the final cleaning with water was excessively long, the terminated H atoms are uncombined. Alternatively, when the samples were left dipped in distilled water for a long period of time, a spontaneous oxide film was made thick by, e.g., $O_2$ and $CO_2$ dissolved in the distilled water. Note that when samples were cleaned with the ammonia/hydrogen peroxide solution, the same tendency as described above occurred. When surface modification was performed by a plasma following the same procedures as in Example 1 upon selective formation, Al could be deposited on the entire surface of the substrate and a wiring layer could be formed.

Example 3

Square contact holes each having a side of 1 μm were formed in each monocrystalline wafer such that the surface of the wafer had an aspect ratio of 1 or more, thereby obtaining 12 wafers. The number of contact holes in each wafer was 500,000.

Selective deposition and non-selective deposition of Al was performed on these samples by the film formation method as in Example 1. Samples (1) to (12) were obtained under the same conditions except that plasma electron densities (DP) were different from each other.

50 wiring patterns obtained by connecting 5,000 contact holes in each wafer were formed by photolithography, and an open/short test of these wiring patterns was performed.

As a result, the number of wiring patterns free from defects is defined as M.

| Sample No. | Plasma Electron Density (DP; cm$^{-3}$) | M |
|---|---|---|
| (1) | $1 \times 10^7$ | 9 |
| (2) | $8 \times 10^7$ | 10 |
| (3) | $1 \times 10^8$ | 40 |
| (4) | $2 \times 10^8$ | 40 |
| (5) | $5 \times 10^8$ | 48 |
| (6) | $8 \times 10^8$ | 49 |
| (7) | $1 \times 10^9$ | 48 |
| (8) | $2 \times 10^9$ | 47 |
| (9) | $5 \times 10^9$ | 40 |
| (10) | $8 \times 10^{10}$ | 39 |
| (11) | $1 \times 10^{11}$ | 9 |
| (12) | $5 \times 10^{11}$ | 8 |

Example 4

Samples (two samples for each sample No.) formed in Example 3 were prepared. These samples were heated in an $N_2$ atmosphere at 600° C., and most of the adsorbed hydrogen atoms were eliminated.

One of the samples for each sample No. was subjected to an HF treatment and was cleaned with water. Al films were formed following the same procedures As in Example 3, and an open/short test of these samples was performed.

| Sample No. | HF Treatment Yes | HF Treatment No |
|---|---|---|
| (1) | M = 10 | M = 1 |
| (2) | 90 | 2 |
| (3) | 40 | 13 |
| (4) | 50 | 12 |
| (5) | 41 | 40 |
| (6) | 50 | 30 |
| (7) | 49 | 29 |
| (8) | 48 | 28 |
| (9) | 39 | 10 |
| (10) | 40 | 11 |
| (11) | 8 | 1 |
| (12) | 8 | 2 |

As described above, according to Examples 1 to 4, Al or Al—Si can be deposited in micropatterned via holes having a high aspect ratio and Al or Al—Si wiring patterns can be formed therein. Therefore, the present invention is effective as a micropatterning technique for LSIs, and the yield of LSIs can be further increased.

Example 5

Procedures for forming an Al film will be described below.

By using the apparatus shown in FIG. 3, the reaction tube 2 is evacuated to about $1 \times 10^{-8}$ Torr by the evaluation unit 9. Note that Al is grown even if the degree of vacuum in the reaction tube 2 is less than $1 \times 10^{-8}$ Torr.

After the Si wafer is cleaned as described above (the chemical pre-treatment), the convey chamber 10 is set at the atmospheric pressure to load the Si wafer in the convey chamber. The convey chamber is evacuated to about $1 \times 10^{-6}$ Torr, the gate valve 13 is opened, and the wafer is held in the wafer holder 3.

After the wafer is held in the wafer holder 3, the gate valve 13 is closed, and the reaction chamber 2 is evacuated to about $1 \times 10^{-8}$ Torr.

In this example, DMAH is supplied from the first gas line. A carrier gas for the DMAH line is H2. The second gas line is used for $H_2$.

$H_2$ is supplied from the second line and the opening degree of the slow leak valve 8 is controlled to set the internal pressure of the reaction tube 2 to a predetermined value. A typical pressure in this example is about 1.5 Torr. Thereafter, the heater 4 is energized to heat the wafer. When the wafer temperature reaches a predetermined temperature, DMAH is supplied from the DMAH line to the reaction tube. The total pressure is about 1.5 Torr, and the partial pressure of DMAH is set to be about $2\times10^{-2}$ Torr. When this DMAH is supplied to the reaction tube 2, Al is deposited. This Al film is defined as the first Al film.

When a predetermined deposition time has elapsed, a voltage is applied from an RF (13.56 MHz) power source to the excitation electrode 16 without interrupting DMAH supply, thereby generating an $H_2$ plasma. Ring-like electrodes are arranged to interpose the ring-like electrode applied with the RF power and are set at the ground potential, so that the plasma can be properly shaped. The decomposition reaction is performed by a plasma by an RF power of 20 W, an electron density of $1\times10^9$ $cm^{-3}$ near the substrate surface, and an electron temperature of 6.5 eV near the substrate surface. That is, the hydrogen atoms and the electrons are supplied from the plasma to the substrate, thereby performing a surface modification process. Upon radiation of the plasma for one minute, RF supply is stopped. When DMAH and $H_2$ are kept supplied, Al is deposited on the deposited Al film and the $SiO_2$ film. When a predetermined deposition time has elapsed, supply of the DMAH is stopped. An Al film deposited-in this process is defined as the second Al film.

In the above sample, in the temperature range of 160° C. to 450° C. in the first Al film deposition process, Al is not deposited on $SiO_2$, but Al is deposited on only the Si-exposed portion to a thickness equal to that of $SiO_2$. In the second Al film deposition process, Al is deposited on both the first Al film and $SiO_2$ at the same deposition rate. The heater 4 is stopped, and the wafer is cooled. Supply of the $H_2$ gas is stopped, and the reaction vessel is evacuated. The wafer is transferred to the convey chamber. Only the convey chamber is set at the atmospheric pressure, and the wafer is unloaded. These procedures are steps in forming an Al film.

Samples of this example will be formed below.

An Si substrate (n-type; 1 to 2 $\mu\Omega\cdot cm$) was thermally oxidized at a temperature of 1,000° C. according to a hydrogen combustion system ($H_2$: 41/M; $O_2$: 21/M).

The film thickness fell within the range of 7,000 Å±500 Å, and the refractive index was 1.46. A photoresist was applied to the entire surface of the Si substrate, and a desired pattern was printed by a stepper. This pattern had various holes having sizes ranging from 0.25 μm×0.25 μm to 100 μm×100 μm. The photoresist was developed to obtain a photoresist pattern, and underlying $SiO_2$ was etched using the photoresist pattern as a mask by reactive ion etching (RIE), thereby partially exposing the Si substrate. 130 samples having holes which had various sizes ranging from 0.25 μm×0.25 μm to 100 μm×100 μm and were formed in $SiO_2$ were prepared. W barrier metal layers each having a thickness of about 500 Å were formed on the respective samples by a CVD method using $WF_6$. Following the same procedures as described above, Al was deposited on these 130 samples at 13 different substrate temperatures in units of ten samples.

The conditions in the first Al film deposition process, the surface modification process, and the second Al film deposition process are as follows.

| First Al Film Deposition Process | |
| --- | --- |
| Total Pressure | 1.5 Torr |
| Partial Pressure of DMAH | $2 \times 10^{-2}$ Torr |
| Surface Modification Process | |
| Total Pressure | 1.5 Torr |
| Partial Pressure of DMAH | $1.5 \times 10^{-4}$ Torr |
| RF Power | 20 W |
| Surface Electron Density | $1 \times 10^9$ $cm^{-3}$ |
| Plasma Radiation Time | 1 minute |
| Second Al Film Deposition Process | |
| Total Pressure | 1.5 Torr |
| Partial Pressure of DMAH | $2 \times 10^{-2}$ Torr |

The resultant Al films deposited at 13 different substrate temperatures were evaluated by various evaluation methods. Results are shown in Table 2A.

TABLE 2A

| Evaluation Item | Substrate Temperature (°C.) | | | | | | | | | | | | |
| --- | --- | --- | --- | --- | --- | --- | --- | --- | --- | --- | --- | --- | --- |
| | 150 | 160 | 200 | 250 | 270 | 300 | 330 | 350 | 370 | 400 | 430 | 450 | 470 |
| Carbon Content (%) | — | 0 | 0 | 0 | 0 | 0 | 0 | 0 | 0 | 0 | 0 | 0 | 1 to 9 |
| Resistivity (μΩ · cm) | — | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 | 2.7 to 3.3 |
| Reflectance (%) | — | 85 to 95 | 85 to 95 | 85 to 95 | 85 to 95 | 85 to 95 | 85 to 95 | 85 to 95 | 85 to 95 | 70 | 60 or less | 60 or less | |
| Average Wiring Service Life (hour) | — | $10^3$ to $10^4$ | $10^3$ to $10^4$ | $10^3$ to $10^4$ | $10^3$ to $10^4$ | $10^3$ to $10^4$ | $10^3$ to $10^4$ | $10^3$ to $10^4$ | $10^3$ to $10^4$ | $10^3$ to $10^4$ | $10^2$ to $10^3$ | $10^2$ to $10^3$ | $10^2$ to $10^3$ |
| Deposition Rate (Å/min) | — | 1 to 9 | 800 to 1800 | 800 to 1800 | 1800 to 2000 | 1800 to 2000 | 1800 to 2000 | 1800 to 2000 | 1800 to 2000 | 1800 to 2100 | 1800 to 2100 | 1800 to 2100 | 2200 |
| Hillock Density ($cm^{-2}$) | — | 0 to $10^3$ | 0 to $10^3$ | 0 to $10^3$ | 0 to 10 | 0 to 10 | 0 to 10 | 0 to 10 | 0 to $10^4$ | 0 to $10^4$ | 0 to $10^4$ | 0 to $10^4$ | 0 to $10^4$ |
| Spike Generation Rate (%) | — | 0 to 10 | 0 to 10 | 0 | 0 | 0 | 0 | 0 | 0 to 30 | 0 to 30 | 0 to 30 | 0 to 30 | 0 to 30 |

(Notes)
No deposition occurs at a substrate temperature of 150° C.
The average wiring service life is defined as a period for wiring disconnection when a current having a current density of $1 \times 10^6$ of $A/cm^2$ is supplied to a 1-μm sectional area at 250° C.
The spike generation rate is defined as a breakdown probability of a junction having a depth of 0.10 μm.

Al was deposited by changing the partial pressure of the DMAH at a substrate temperature of 270° C. following the same procedures as in Example 5. The results are obtained as follows:

| Partial Pressure of DMAH (Torr) | Deposition Rate (Å/min) | Stress Migration Durability (hours) |
| --- | --- | --- |
| $1.0 \times 10^{-3}$ | 200 | 220 |
| $3.0 \times 10^{-3}$ | 400 | 240 |
| $7.0 \times 10^{-3}$ | 1400 | 880 |
| $1.0 \times 10^{-2}$ | 1800 | 800 |
| $4.0 \times 10^{-2}$ | 2300 | 950 |
| $9.0 \times 10^{-2}$ | 3000 | 850 |
| $1.0 \times 10^{-1}$ | 3300 | 310 |
| $1.5 \times 10^{-1}$ | 3300 | 105 |

Figure 6:
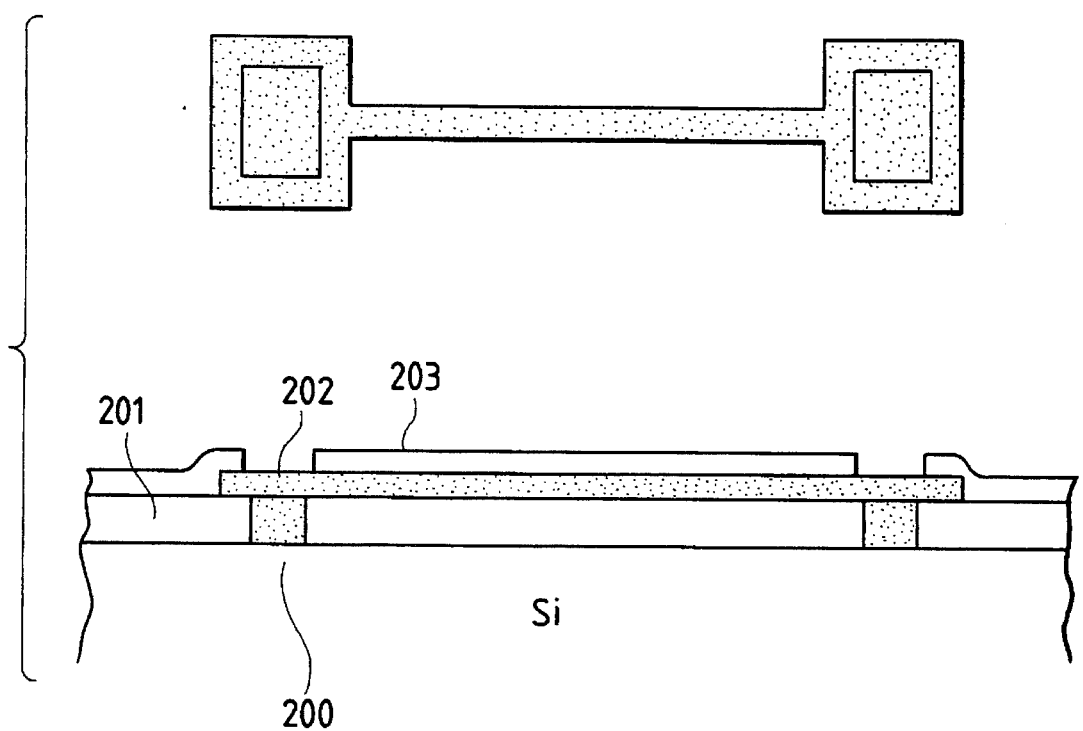
FIG. 6 is a view showing a sample for evaluating stress migration.

Samples were further treated from the samples of Example 1 to evaluate the stress migration durability. More specifically, in each of these samples, Al (thickness: 0.5 µm) was patterned to have a width of 0.8 µm on an insulating film, and a silicon nitride film was deposited thereon (FIG. 6). Each sample was left to stand at a temperature of 200° C., and a time required for Al film disconnection was measured. FIG. 6 shows each sample. The sample comprises an Si substrate 200, a silicon oxide film 201 having an opening, an Al film 202, and a silicon oxide film 203.

When the partial pressure of the DMAH was set to fall within the range of $7 \times 10^{-3}$ to $9 \times 10^{-2}$ Torr, Al was deposited at a high deposition rate, and an Al film having excellent stress migration durability could be formed.

Characteristics of an interface between the Al film obtained by selective deposition and the Al film obtained by non-selective deposition were good. It may be assumed that impurities are not mixed in the resultant film due to a high deposition rate.

In the above samples, in the temperature range of 160° C. to 450° C., Al was selectively deposited on only the Si-exposed portions to have the same thickness as that of $SiO_2$ in the first Al deposition process. In the second Al film deposition process, Al was deposited on both the Al film deposited in the first Al film deposition process and the $SiO_2$ surface at the same deposition rate.

The Al film selectively formed on Si and the Al film deposited on $SiO_2$ upon surface modification had identical film quality in resistivity, reflectance, and hillock generation density upon annealing.

An increase in resistance at the interface between the first and second Al films did not occur.

Example 6

In the pre-treatment prior to deposition in Example 5, "Cleaning by $H_2SO_4/H_2O_2$ (=3/1))+(Cleaning with Water)+ (Cleaning by $HF/H_2O$ (=1/40))+(Cleaning with Water)" described above was performed. At this time, the final cleaning with water for a time T was changed to deposit Al following the same procedures as in Example 1.

Results are shown in Table 3 below.

TABLE 3

| Time T (min.) | Crystalline State on Si | Peak-to-Peak Distance of Al | Si/SiO$_2$ Selectivity |
| --- | --- | --- | --- |
| 0 | Polycrystalline | 1500 Å PP | Formation of Al Nucleus on Si |
| 3 | Monocrystalline | 105 Å PP | Good |
| 5 | Monocrystalline | 89 Å PP | Good |
| 7 | Monocrystalline | 110 Å PP | Good |
| 10 | Monocrystalline | 94 Å PP | Good |
| 15 | Monocrystalline | 270 Å PP | Good |

TABLE 3-continued

| Time T (min.) | Crystalline State on Si | Peak-to-Peak Distance of Al | Si/SiO$_2$ Selectivity |
| --- | --- | --- | --- |
| 18 | Polycrystalline | 800 Å PP | Good |
| 20 | Polycrystalline | 1125 Å PP | Good |

In the above results, the substrate surface upon cleaning with HF in the pre-treatment was set to be terminated with the H and F atoms. A sample which was not finally sufficiently cleaned with water (T=0 minutes) had a thicker spontaneous oxide film on Si than those of other samples, thus interrupting monocrystalline growth. When the final cleaning with water appropriately ranged from 3 to 15 minutes, only F atom bonds were eliminated, and the H atoms which contributed to the reaction tended to be terminated, thereby selectively growing Al.

When the final cleaning with water was excessively long, the terminated H atoms are uncombined. Alternatively, when the samples were left dipped in distilled water for a long period of time, a spontaneous oxide film was made thick by, e.g., $O_2$ and $CO_2$ dissolved in the distilled water, thereby preventing monocrystallization during Al deposition. Note that when samples were cleaned with the RCA, the same tendency as described above occurred. When surface modification was performed by a plasma following the same procedures as in Example 1 upon selective formation, Al could be deposited on the entire surface of the substrate and a wiring layer could be formed.

Example 7

Square contact holes each having a side of 1 µm were formed in each monocrystalline wafer such that the surface of the wafer had an aspect ratio of 1 or more, thereby obtaining 12 wafers. The number of contact holes in each wafer was 800,000.

Selective deposition and non-selective deposition of Al was performed on these samples by the film formation method as in Example 5. Samples (1) to (12) were obtained under the same conditions except that plasma electron densities (DP) were different from each other.

50 wiring patterns obtained by connecting 10,000 contact holes in each wafer were formed by photolithography, and an open/short test of these wiring patterns was performed.

As a result, the number of wiring patterns free from defects is defined as M.

| Sample No. | Plasma Electron Density (DP; cm$^{-3}$) | M |
| --- | --- | --- |
| (1) | $1 \times 10^7$ | 10 |
| (2) | $8 \times 10^7$ | 10 |
| (3) | $1 \times 10^8$ | 41 |
| (4) | $2 \times 10^8$ | 40 |
| (5) | $5 \times 10^8$ | 50 |
| (6) | $8 \times 10^8$ | 48 |
| (7) | $1 \times 10^9$ | 49 |
| (8) | $2 \times 10^9$ | 47 |
| (9) | $5 \times 10^9$ | 40 |
| (10) | $8 \times 10^{10}$ | 41 |
| (11) | $1 \times 10^{11}$ | 9 |
| (12) | $5 \times 10^{11}$ | 8 |

Example 8

Samples (two samples for each sample No.) formed in Example 7 were prepared. These samples were heated in an $N_2$ atmosphere at 600° C., and most of the adsorbed hydrogen atoms were eliminated.

One of the samples for each sample No. was subjected to an HF treatment and was cleaned with water. Al films were formed following the same procedures as in Example 7, and an open/short test of these samples was performed.

| | HF Treatment | |
|---|---|---|
| Sample No. | Yes | No |
| (1) | M = 9 | M = 1 |
| (2) | 10 | 2 |
| (3) | 41 | 10 |
| (4) | 41 | 12 |
| (5) | 50 | 30 |
| (6) | 49 | 28 |
| (7) | 49 | 29 |
| (8) | 48 | 28 |
| (9) | 40 | 11 |
| (10) | 40 | 11 |
| (11) | 8 | 2 |
| (12) | 8 | 2 |

Example 9

Samples as in Example 7 were prepared, and the partial pressure of DMAH was changed under the same conditions as in Example 7, thereby evaluating the yield.

As a result, M values of the sample (2) (i.e., plasma electron density: $8 \times 10^{-7}$ cm$^{-3}$) and the sample (11) (i.e., plasma electron density: $1 \times 10^{11}$ cm$^{-3}$) at the partial pressures of DMAH of $7 \times 10^{-3}$ to $9 \times 10^{-2}$ Torr were increased to about M=40.

According to this example, a high-quality film containing Al as a major constituent which has excellent stress migration durability can be formed at a high deposition rate.

Example 10

Samples having contact holes in SiO$_2$ on monocrystalline Si were prepared as in Example 1.

Thin polycrystalline tungsten (W) films were formed in the respective contact holes by a selective deposition method using WF$_6$ by following the same procedures as in Example 1.

The chemical surface-treatment as in Example 1 was performed to terminate uncombined bonds of the W film surface with hydrogen atoms. Thereafter, the partial pressure of DMAH was changed as in Example 1 to formal films. The characteristics of the resultant samples were better than those in Examples 1 and 5. There can be provided a highly reliable semiconductor device wherein a probability for producing a sample having excellent migration durability is high and reproducibility is good.

According to the present invention, since adhesion strength can be improved when an Al wiring layer is connected to a non-monocrystalline electrode such as a gate electrode, a barrier metal electrode, and a polysilicon electrode, a deposition film having high reliability and good reproducibility can be formed.

According to the present invention, by controlling a plasma, reliability can be improved when an Al film is deposited on the non-electron donor surface.

Furthermore, according to the present invention, the partial pressure of an organic metal is controlled to increase a deposition rate of the Al film.

What is claimed is:

1. A method of forming a deposition film, comprising steps of:

locating a substrate in a deposition film formation space of a CVD apparatus capable of generating a plasma, said substrate having an electron donor surface consisting of a non-monocrystalline material and a non-electron donor surface;

supplying a gas of an alkylaluminum hydride to said deposition film formation space;

selectively forming a metal film consisting essentially of aluminum on said electron donor surface while said electron donor surface is kept at a temperature ranging from less than a decomposition temperature of the alkylaluminum hydride to 450° C.;

generating the plasma in said CVD apparatus while the gas of the alkylaluminum hydride is supplied, and forming said metal film consisting essentially of aluminum and a metal film containing aluminum as a major constituent on said non-electron donor surface, wherein the plasma having a plasma area having an electron density of the plasma falling within a range of $5 \times 10^8$ to $8 \times 10^{10}$ cm$^{-3}$ near a surface of said substrate is generated to form said metal film.

2. A method according to claim 1, wherein the alkylaluminum hydride is dimethylaluminum hydride.

3. A method according to claim 1, wherein the electron density of the plasma falls within a range of $5 \times 10^8$ cm$^{-3}$ to $2 \times 10^9$ cm$^{-3}$ near said surface of said substrate.

4. A method of forming a deposition film, comprising the steps of:

locating a substrate in a deposition film formation space of a CVD apparatus capable of generating a plasma, said substrate having an electron donor surface consisting of a non-monocrystalline material and a non-electron donor surface;

supplying a gas of an alkylaluminum hydride to said deposition film formation space so that a partial pressure of the gas of alkylaluminum hydride falls within a range of $7 \times 10^{-3}$ to $9 \times 10^{-2}$ Torr;

selectively forming a metal film consisting essentially of aluminum on said electron donor surface while said electron donor surface is kept at a temperature ranging from no less than a decomposition temperature of the alkylaluminum hydride to 450° C.; and generating the plasma in said CVD apparatus while the alkylaluminum hydride is supplied, and forming a metal film consisting essentially of aluminum on said non-electron donor surface, wherein the plasma having an electron density within a range of $1 \times 10^8$ to $8 \times 10^{10}$ cm$^{-3}$ near a surface of said substrate is generated to form said metal film.

* * * * *

UNITED STATES PATENT AND TRADEMARK OFFICE
CERTIFICATE OF CORRECTION

PATENT NO. : 5,492,734            Page 1 of 4

DATED     : February 20, 1996

INVENTOR(S): MATSUMOTO ET AL.

It is certified that error appears in the above-identified patent and that said Letters Patent is hereby corrected as shown below:

On the title page: Item [56]

```
    Line USPD, "Veki et al." should read --Ueki et al.--.
    Line OP, "tor." K. Tsubouchi et al.," should read
            --tor." ¶ K. Tsubouchi et al.,--.

Line OP, In "J.A. Thornton," "Applictions"," should read
            --Applications",--.
```

COLUMN 3

```
    Line 16, "halide" should read --hydride--.
```

COLUMN 4

```
    Line 21, "vary" should read --varies--.
```

COLUMN 5

```
    Line 60, "deposed" should read --deposited--.
```

COLUMN 8

```
    Line 18, "an" should read --a--.
```

UNITED STATES PATENT AND TRADEMARK OFFICE
CERTIFICATE OF CORRECTION

PATENT NO.   :  5,492,734

DATED        :  February 20, 1996

INVENTOR(S)  :  MATSUMOTO ET AL.

It is certified that error appears in the above-identified patent and that said Letters Patent is hereby corrected as shown below:

COLUMN 10

Line 63, "in" should read --an--.

COLUMN 11

Line 61, "very" should be deleted.
    Line 66, "27o°C." should read --270°C.--.

COLUMN 14

Line 14, "CH3" should read --$CH_3$--.
    Line 35, "CH3" should read --$CH_3$--.
    Line 38, "In fine, the" should read --The--.

COLUMN 16

Line 3, "flatness.." should read --flatness.--.

COLUMN 20

Line 16, "As" should read --as--.

UNITED STATES PATENT AND TRADEMARK OFFICE
CERTIFICATE OF CORRECTION

PATENT NO. : 5,492,734

DATED : February 20, 1996

INVENTOR(S): MATSUMOTO ET AL.

It is certified that error appears in the above-identified patent and that said Letters Patent is hereby corrected as shown below:

COLUMN 21

Line 24, "deposited-in" should read --deposited in--.
Line 62, "An" should read --A--.

COLUMN 23

Line 20, "measured. FIG. 6" should read --measured. ¶ FIG. 6-- and "sample. The" should read --sample. ¶ The--.

UNITED STATES PATENT AND TRADEMARK OFFICE
CERTIFICATE OF CORRECTION

PATENT NO. : 5,492,734
DATED : February 20, 1996
INVENTOR(S) : Matsumoto et al

It is certified that error appears in the above-indentified patent and that said Letters Patent is hereby corrected as shown below:

Column 25, line 47, "formal" should read --form Al--.

Column 26, line 5, "comprising" should read --comprising the --.

Signed and Sealed this

Twenty-third Day of July, 1996

Attest:

BRUCE LEHMAN

*Attesting Officer*    *Commissioner of Patents and Trademarks*